US012625208B2

(12) United States Patent
Ma et al.

(10) Patent No.: US 12,625,208 B2
(45) Date of Patent: May 12, 2026

(54) MAGNETIC RESONANCE SYSTEM AND GRADIENT AMPLIFIER FILTER FOR MAGNETIC RESONANCE SYSTEM

(71) Applicant: GE Precision Healthcare LLC, Waukesha, WI (US)

(72) Inventors: Gang Ma, Beijing (CN); Yanan Chen, Beijing (CN); Tao He, Beijing (CN); Haiyuan Sun, Beijing (CN); Haoyang Gan, Beijing (CN)

(73) Assignee: GE Precision Healthcare LLC, Waukesha, WI (US)

( * ) Notice: Subject to any disclaimer, the term of this patent is extended or adjusted under 35 U.S.C. 154(b) by 197 days.

(21) Appl. No.: 18/769,219

(22) Filed: Jul. 10, 2024

(65) Prior Publication Data

US 2025/0035725 A1 Jan. 30, 2025

(30) Foreign Application Priority Data

Jul. 26, 2023 (CN) .......................... 202310927658.6

(51) Int. Cl.
*G01R 33/38* (2006.01)
*G01R 33/385* (2006.01)

(52) U.S. Cl.
CPC .............................. *G01R 33/3852* (2013.01)

(58) Field of Classification Search
CPC ..... G01R 33/3852; G01R 33/34; G01R 33/36
See application file for complete search history.

(56) References Cited

U.S. PATENT DOCUMENTS

2012/0022364 A1* 1/2012 Caruba .................. A61B 6/037
361/818

* cited by examiner

*Primary Examiner* — G.M. A Hyder

(57) ABSTRACT

The present invention relates to a magnetic resonance system and a gradient amplifier filter for a magnetic resonance system. The filter includes a plurality of non-magnetic core inductors and a printed circuit board having a multilayer structure, a plurality of filter capacitors being formed in a plurality of regions of the printed circuit board, respectively, wherein each non-magnetic core inductor is provided on the printed circuit board and spanning two of the plurality of filter capacitors.

13 Claims, 11 Drawing Sheets

MAGNETIC RESONANCE SYSTEM AND GRADIENT AMPLIFIER FILTER FOR MAGNETIC RESONANCE SYSTEM

CROSS REFERENCE TO RELATED APPLICATIONS

The present application claims priority and benefit of Chinese Patent Application No. 202310927658.6 filed on Jul. 26, 2023, which is incorporated herein by reference in its entirety.

TECHNICAL FIELD

The present invention relates to the field of medical imaging, and in particular to a magnetic resonance system and a gradient amplifier filter for a magnetic resonance system.

BACKGROUND

Magnetic resonance (MR) technology is one of the main imaging methods in modern medicine. A magnetic resonance system typically includes a gradient coil that interacts with a main magnetic field generated by a main magnet to generate a magnetic field gradient, so as to perform spatial position encoding of a magnetic resonance signal received from a human body, enabling reconstruction of an image of a body tissue on the basis of the encoded magnetic resonance signal.

The gradient coil is usually close to the main magnet, e.g., integrated in a housing of a scanning device together with the main magnet, a cavity for accommodating a scan subject being formed in the housing. The scanning device having the main magnet and the gradient coil is provided in a scan room, and the scan room and an equipment room are each separate building spaces physically spaced apart from each other. The gradient coil typically requires a large drive current, and the drive current is provided via a gradient amplifier. In the prior art, the gradient amplifier is provided in the equipment room. One reason is that the accommodating space of the magnet housing in the scan room is limited, and another reason is that when the gradient amplifier and a component connected thereto are close to the main magnet, magnetic saturation may occur due to the influence of the main magnetic field, thereby seriously affecting imaging quality.

SUMMARY

One aspect of the present invention provides a gradient amplifier filter for a magnetic resonance system, comprising a plurality of non-magnetic core inductors and a printed circuit board having a multilayer structure, a plurality of filter capacitors being formed in a plurality of regions of the printed circuit board, respectively, wherein each non-magnetic core inductor is provided on the printed circuit board and across two of the plurality of filter capacitors.

Another aspect of the present invention provides a magnetic resonance system, comprising a magnet housing and the gradient amplifier filter described above, a main magnet, a gradient coil and a gradient amplifier being provided in the magnet housing, and the filter comprising an input end connected to the gradient amplifier and an output end connected to the gradient coil.

It should be understood that the brief description above is provided to introduce, in a simplified form, concepts that will be further described in the detailed description. The brief description above is not meant to identify key or essential features of the claimed subject matter. The scope is defined uniquely by the claims that follow the detailed description. Furthermore, the claimed subject matter is not limited to implementations that solve any deficiencies raised above or in any section of the present disclosure.

BRIEF DESCRIPTION OF THE DRAWINGS

The present invention will be better understood by reading the following description of non-limiting examples with reference to the accompanying drawings, wherein

FIG. 10 and FIG. 11 each show a schematic diagram of an attenuation test performed on a gradient amplifier filter according to an embodiment of the present invention, wherein FIG. 10 shows a result of a common mode attenuation test, and FIG. 11 shows a result of a differential mode attenuation test.

Together with the following description, the accompanying drawings illustrate and explain structural principles, methods, and principles described herein. In the accompanying drawings, the thickness and dimensions of the components may be enlarged or otherwise modified for clarity. Well-known structures, materials, or operations are not shown or described in detail to avoid obscuring the components and systems described.

DETAILED DESCRIPTION

Specific embodiments of the present invention will be described below. It should be noted that in the specific description of said embodiments, for the sake of brevity and conciseness, the present description cannot describe all of the features of the actual embodiments in detail. It should be understood that in the actual implementation process of any embodiment, just as in the process of any one engineering project or design project, a variety of specific decisions are often made to achieve specific goals of the developer and to meet system-related or business-related constraints, which may also vary from one embodiment to another. Furthermore, it should also be understood that although efforts made in such development processes may be complex and tedious, for a person of ordinary skill in the art related to the content disclosed in the present invention, some design, manufacture, or production changes made on the basis of the technical content disclosed in the present disclosure are only common technical means, and should not be construed as the content of the present disclosure being insufficient.

Unless otherwise defined, the technical or scientific terms used in the claims and the description should be as they are usually understood by those possessing ordinary skill in the technical field to which they belong. Terms such as "first", "second", and similar terms used in the present description and claims do not denote any order, quantity, or importance, but are only intended to distinguish different constituents. The terms "one" or "a/an" and similar terms do not express a limitation of quantity, but rather that at least one is present. The terms "include" or "comprise" and similar words indicate that an element or object preceding the terms "include" or "comprise" encompasses elements or objects and equivalent elements thereof listed after the terms "include" or "comprise", and do not exclude other elements or objects. The terms "connect" or "link" and similar words are not limited to physical or mechanical connections, and are not limited to direct or indirect connections. Furthermore, it should be understood that references to "an example" or "examples" of the present disclosure are not intended to be construed as excluding the existence of additional implementations that also incorporate the referenced features.

Figure 1:
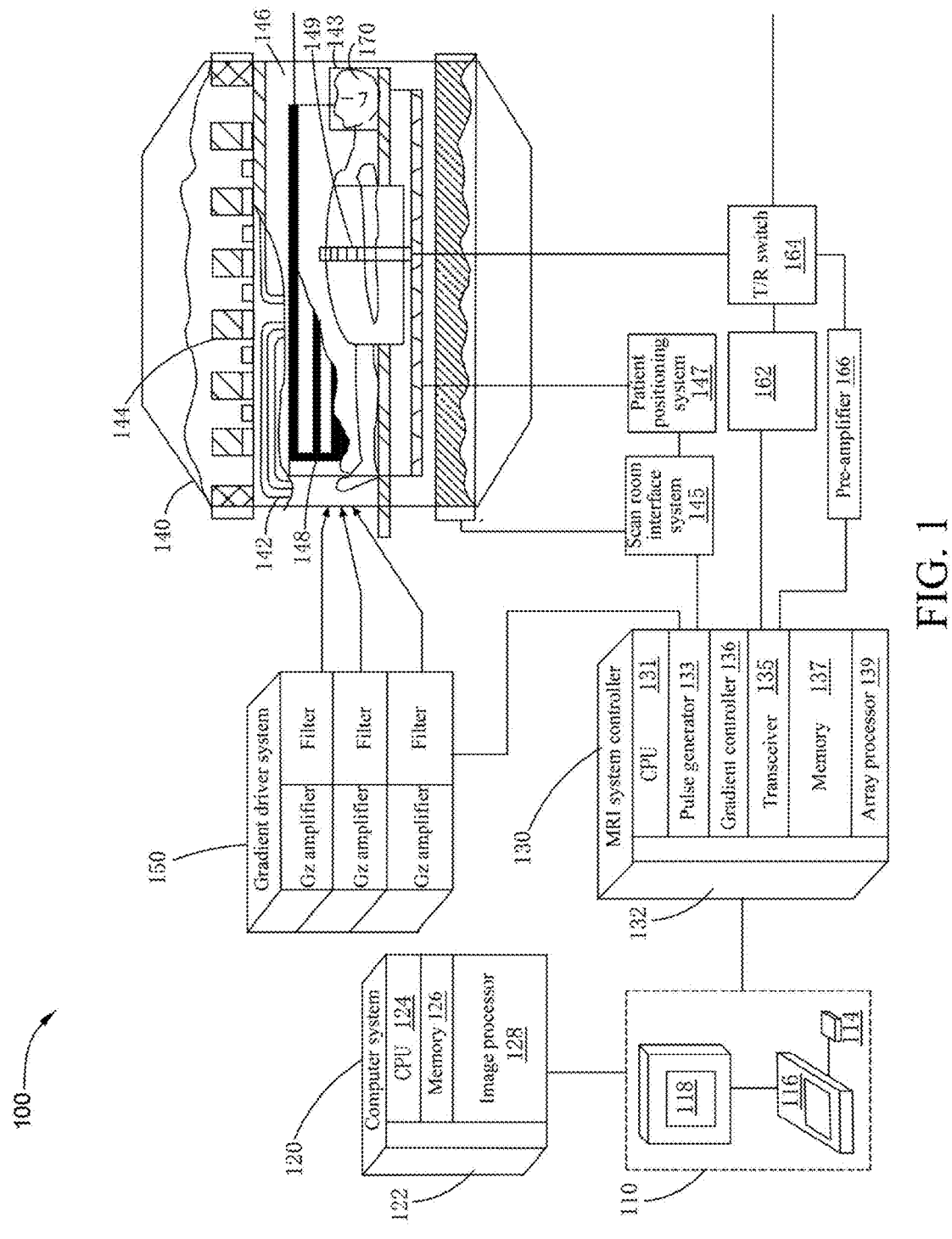
FIG. 1 shows a schematic structural diagram of an exemplary magnetic resonance system 100 according to some embodiments.

FIG. 1 illustrates a schematic diagram of an exemplary magnetic resonance (MR) system 100 according to some examples of the present invention.

As shown in FIG. 1, an operator workstation 110 is configured to control an operation of the MR system 100, the operator workstation 110 including an input apparatus 114, a control panel 116, and a display 118. The input apparatus 114 may be a joystick, a keyboard, a mouse, a trackball, a touch-activated screen, voice control, or any similar or equivalent input apparatus. The control panel 116 may include a keyboard, a touch-activated screen, voice control, a button, a slider, or any similar or equivalent control apparatus. The operator workstation 110 is coupled to and communicates with a computer system 120, and provides an interface to allow an operator to plan a magnetic resonance scan, display an image, perform image processing, and store data and images. The computer system 120 enables the operator to control (e.g., by means of the input apparatus) the generation and viewing of images and other monitoring information on the display 118, and also to perform human-computer interaction by means of a user interface displayed on the display 118. The human-computer interaction can be used to: input information required for the scan, determine scan parameters, perform operations for image processing, select images, view quality assessment results for the selected images, etc. The above information required for the scan may include information about a scan subject, for example, one or a plurality of gender, age, height, and body weight. The above scan parameters may include one or a plurality of a scan site, a scan sequence, a selected transmit coil, a selected receive coil, a scan sequence, etc.

The computer system 120 includes a plurality of modules that communicate with one another by means of an electrical and/or data connection module 122. The connection module 122 may be a wired communication link, an optical fiber communication link, a wireless communication link, and the like. The computer system 120 may include a central processing unit (CPU) 124, a memory 126, and an image processor 128. In some embodiments, the image processor 128 may be replaced by an image processing function run in the CPU 124. The computer system 120 may be connected to an archive media apparatus, a persistent or backup memory, or a network. The computer system 120 may be coupled to and communicates with a separate MR system controller 130.

The MR system controller 130 includes a set of modules that communicate with one another by means of an electrical and/or data connection module 132. The connection module 132 may be a direct wired communication link, an optical fiber communication link, a wireless communication link, and the like. In an alternative embodiment, modules of the computer system 120 and the MR system controller 130 may be implemented on the same computer system or on a plurality of computer systems. The MR system controller 130 may include a CPU 131, a sequence pulse generator 133 that communicates with the operator workstation 110, a transceiver (or an RF transceiver) 135, a gradient controller 136, a memory 137, and an array processor 139.

The magnetic resonance system 100 may include a resonance assembly 140 and a housing (not shown in the figure) for accommodating the resonance assembly 140. A subject 170 undergoing the magnetic resonance scan may be positioned within a cylindrical imaging volume 146 of the resonance assembly 140. The resonance assembly 140 includes a superconducting magnet having a superconducting coil 144, a radio-frequency coil assembly, and a gradient coil assembly 142. During operation, the superconducting coil 144 provides a static uniform longitudinal magnetic field $B_0$ throughout the cylindrical imaging volume 146. The radio-frequency coil assembly may include a body coil 148 and a surface coil 149, and may be used to send and/or receive a radio-frequency signal. The radio-frequency coil assembly may further include a local coil 143, for example, a head coil. The gradient coil assembly 142 is disposed around a main magnet to form part of the resonance assembly 140. Specifically, the gradient coil assembly 142 is sleeved between the superconducting magnet and the radio-frequency coil assembly, and may include three gradient coils, provided along the X-axis, Y-axis, and Z-axis of the magnetic resonance system, respectively.

The radio-frequency body coil 148 and the local coil 143 may be connected to a toggle switch (not shown in the drawing), the toggle switch being controlled by the MR system controller 130 to toggle between the radio-frequency body coil 148 and the local coil 143. In some examples, based on the confirmation of the scan site, the body coil 148 or the local coil 143 may be selected for imaging. For example, when a systemic scan is performed, the body coil 148 may be selected based on an operation on the toggle switch, and when a local scan is performed, the local coil 143 may be selected based on an operation on the toggle switch. The local scan may include, for example, a head scan, an abdominal scan, or a scan of another body part.

The MR system controller 130 may receive a command from the operator workstation 110 to indicate an MR scan sequence that is to be executed during an MR scan. The "scan sequence" above refers to a combination of pulses that have specific intensities, shapes, time sequences, and the like and that are applied when a magnetic resonance imaging scan is executed. The pulses may typically include, for example, a radio-frequency pulse and a gradient pulse. The radio-frequency pulses may include, for example, radio-frequency excitation pulses, radio-frequency refocusing pulses, inverse recovery pulses, etc. These radio-frequency pulses may have different amplitudes, phases, flip angles, etc., based on their different effects. For different magnetic resonance systems, due to differences in hardware design, different radio-frequency transmit power may be needed for the same flip angle requirement. The gradient pulse may include, for example, a gradient pulse used for layer selection, a gradient pulse used for phase encoding, a gradient pulse used for frequency encoding, a gradient pulse used for phase shifting (phase shift), a gradient pulse used for dispersion of phases (dephasing), etc. These gradient pulses may also have different amplitudes and/or durations.

Typically, a plurality of scan sequences can be preset in the magnetic resonance system, so that the sequence suitable for clinical detection requirements can be selected. The clinical detection requirements may include, for example, an imaging site, an imaging function, an imaging effect, and the like. For example, the scan sequence may be determined based on a site to be imaged. For example, when it is determined that the imaging site is a head, a human-computer interaction interface may provide a list of sequences corresponding to the head scan. A suitable sequence may also be further determined from the list based on clinically relevant settings.

The gradient pulse in the scan sequence sent by the pulse generator 133 may be generated by the gradient controller 136 and act on a gradient driver 150. The gradient driver 150 includes gradient amplifiers and corresponding gradient amplifier filters, e.g., amplifiers $G_x$, $G_y$, and $G_z$ and corresponding filters shown in FIG. 1. The amplifiers $G_y$, $G_y$, and $G_z$ are used to excite the X-axis, Y-axis and Z-axis gradient coils described above, respectively. The pulse generator 133 may operate each gradient amplifier to achieve the desired timing and shape of the gradient pulses generated during the scan. Each gradient amplifier excites a corresponding gradient coil to generate a magnetic field gradient for spatially encoding an acquired magnetic resonance signal. Specifically, the X-axis gradient coil is used to generate a frequency encoding gradient in the $G_x$ direction, the Y-axis gradient coil is used to generate a phase encoding gradient in the $G_y$ direction, and the Z-axis gradient coil is used to generate a slice selection gradient in the $G_z$ direction. The gradient driver 150 may be provided in an equipment room. In one embodiment of the present invention, an improved gradient amplifier filter is provided, so that part (e.g., each gradient amplifier) or all of the gradient driver 150 is provided in a scan room, e.g., integrated in the housing together with the resonance assembly 140.

The pulse generator 133 is coupled to and communicates with a scan room interface system 145 that can receive signals from various sensors associated with the state of the resonance assembly 140, and various processors arranged in a scan room. The scan room interface system 145 is further coupled to and communicates with a patient positioning system 147, the patient positioning system 147 sending and receiving a signal to control the movement of a patient table to a desired position to perform the MR scan.

The scan room interface system 145 may include, for example, a feed-through plate penetrating (or embedded in) a wall of the scan room. The feed-through plate may be used to provide a gradient amplifier filter for filtering a drive current generated by a gradient amplifier placed in the equipment room, so that a drive current having reduced noise interference can be provided to the gradient coil in the resonance assembly 140 via a cable in the scan room, so as to excite the gradient coil to generate the required magnetic field gradient.

A radio frequency pulse in the scan sequence sent by the pulse generator 133 may be generated by the transceiver 135, and the radio frequency pulse is amplified by a radio frequency power amplifier 162. When the toggle switch is toggled to the body coil 148, the amplified radio-frequency pulse is provided to the body coil 148 via a transmit/receive switch (T/R switch) 164, and the RF body coil 148 then provides a transverse magnetic field $B_1$. The transverse magnetic field $B_1$ is substantially perpendicular to $B_0$ throughout the entire cylindrical imaging volume 146. The transverse magnetic field $B_1$ is used to excite stimulated nuclei in the body of the scan subject so as to generate an MR signal. When the toggle switch 141 is toggled to the local coil 143, the amplified radio-frequency pulse is provided to the local coil 143, so as to provide the transverse magnetic field $B_1$ via the local coil 143.

Specifically, a radio-frequency signal generator of the transceiver 135 may generate a corresponding radio-frequency power signal on the basis of a description (e.g., including one or a plurality of an amplitude, a frequency, transmit power, a representative parameter used to represent the transmit power, etc.) of a radio-frequency pulse in a scan sequence that is predetermined. The radio-frequency power signal is amplified by the radio-frequency power amplifier 162 to then generate a radio-frequency power amplified signal, which is provided to the RF body coil 148 or the local coil 143 via a radio-frequency power transmission module (e.g., including the T/R switch 164).

As described above, the RF body coil 148, the local coil 143, and the RF surface coil 149 may be used to transmit radio-frequency pulses and/or receive MR signals from the scan subject. The MR signals emitted by excited nuclei in the body of the scan subject may be sensed and received by the RF body coil 148, the local coil 143 or the RF surface coil 149, and then sent back to a preamplifier 166 by means of the T/R switch 164. The T/R switch 164 may be controlled by a signal from the MR system controller 130 to electrically connect, during a transmit mode, the radio-frequency power amplifier 162 to the RF body coil 148 and to connect, during a receive mode, the preamplifier 166 to the RF body coil 148. The T/R switch 164 may further enable the RF surface coil 149 and the local coil 143 to be used in the transmit mode or the receive mode.

In some embodiments, the MR signals sensed and received by the RF body coil 148, the local coil 143, or the RF surface coil 149 and amplified by the preamplifier 166 are demodulated, filtered, and digitized in a receiving portion of the transceiver 135, and transmitted as a raw k-space data array to the memory 137 in the MR system controller 130.

A reconstructed magnetic resonance image may be obtained by transforming/processing the stored raw k-space data. For each image to be reconstructed, the data is rearranged into separate k-space data arrays, and each of said separate k-space data arrays is input to the array processor 139, the array processor being operated to transform the data into an array of image data by Fourier transform.

The array processor 139 uses transform methods, most commonly Fourier transform, to create images from the received MR signals. These images are transmitted to the computer system 120 and stored in the memory 126. In response to commands received from the operator workstation 110, the image data may be stored in a long-term memory, or may be further processed by the image processor 128 and transmitted to the operator workstation 110 for presentation on the display 118.

In various embodiments, components of the computer system 120 and MR system controller 130 may be implemented on the same computer system or on a plurality of computer systems. It should be understood that the MR system 100 shown in FIG. 1 is intended for illustration. Suitable MR systems may include more, fewer, and/or different components.

The MR system controller 130 and the image processor 128 may separately or collectively include a computer processor and a storage medium. The storage medium records a program that is for predetermined data processing and that is to be executed by the computer processor. For example, the storage medium may store thereon a program used to implement scanning processing (such as a scan flow, an imaging sequence, parameter determination, etc.), image reconstruction, image processing, and the like. The described storage medium may include, for example, a ROM, a floppy disk, a hard disk, an optical disk, a magneto-optical disk, a CD-ROM, or a non-volatile memory card.

As described above, when the gradient amplifier and a component (e.g., a filter) connected thereto are close to the main magnet, magnetic saturation may occur due to the influence of the main magnetic field. Furthermore, each gradient amplifier includes an electronic switch topology (e.g. an H-bridge), and required gradient drive currents are generated via a pulse width modulation (PWM) controller controlling the connection and disconnection of these electronic switches. During a magnetic resonance scan, the electronic switches are frequently switched, thereby generating interfering noise for the gradient drive currents. The interfering noise is usually filtered out by means of providing a gradient filter. However, considering that the gradient amplifier is provided in the scan room or is close to the main magnet and the gradient coil, more signal interference from space or other functional components may be generated due to more complex spatial arrangements, which causes problems in addition to magnetic saturation. For example, even if the problem of magnetic saturation is solved, a conventional filter cannot achieve the required filtering effect in such spatial arrangements, which increases the difficulty of providing the gradient amplifier in the scan room.

Figure 2:
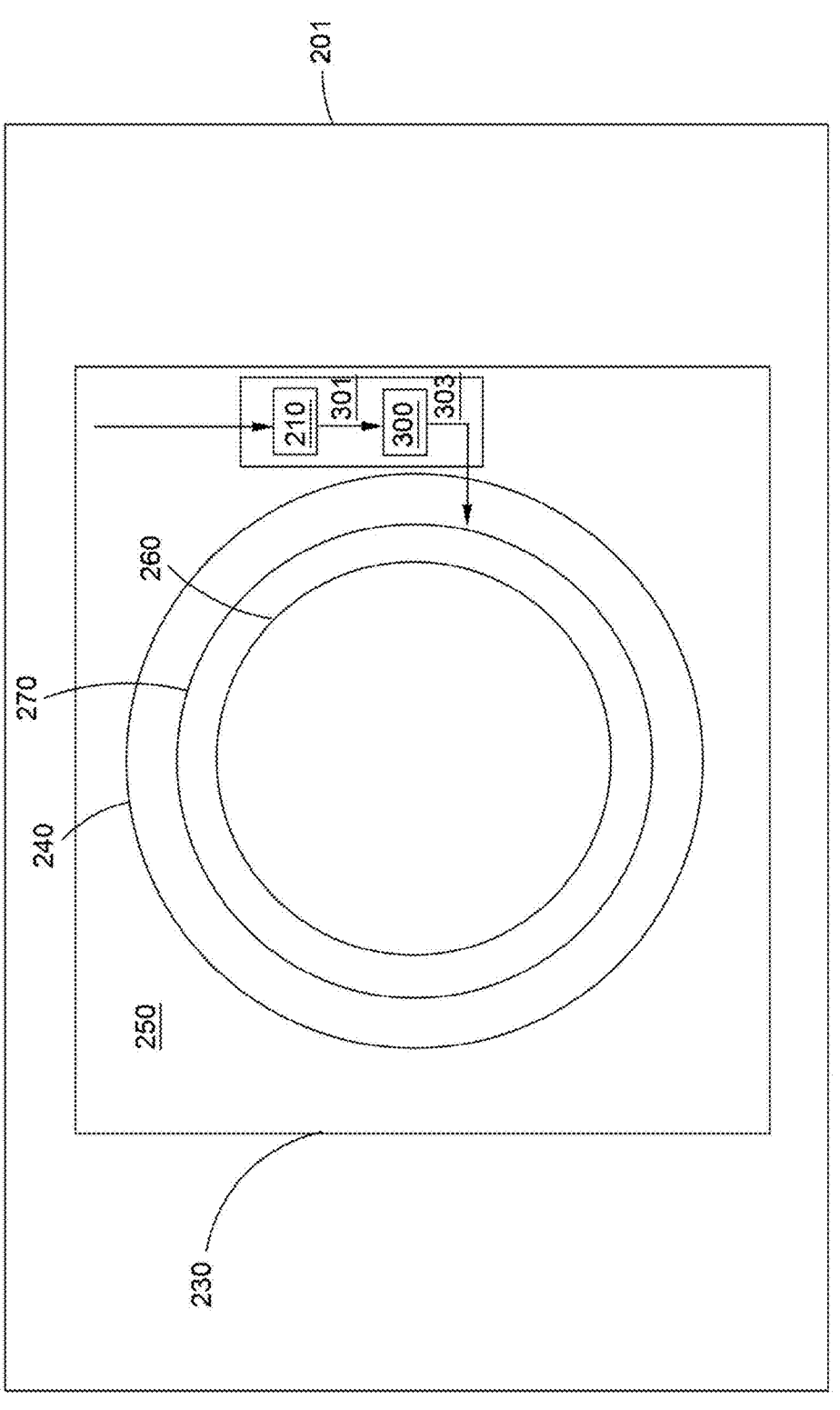
FIG. 2 shows a schematic structural diagram of a magnetic resonance system 200 according to some embodiments of the present invention.

FIG. 2 shows a schematic structural diagram of a magnetic resonance system according to another embodiment of the present invention. One or more gradient amplifiers 210 are provided in a scan room 201, specifically in a space 250 defined by a housing 230 and a main magnet 240. Conventional magnetic resonance subcomponents, such as a radio-frequency coil assembly 260 and a gradient coil assembly 270, may also be provided in the space 250. The one or more gradient amplifiers 210 generate a gradient drive signal according to a received gradient control signal (the control signal being generated by, for example, a controller/control unit provided in an equipment room or the scan room). The gradient drive signal is provided to the gradient coil assembly 260 after being subjected to signal filtering performed by a gradient amplifier filter 300. The space 250 may be further provided with a radio-frequency control subsystem (e.g., including one or a plurality of a radio-frequency signal generator, a radio-frequency power amplifier, a pre-amplifier, a T/R switch, etc.).

The gradient amplifier filter 300 is connected between the corresponding gradient amplifier 210 and a gradient coil of the gradient coil assembly 270. Specifically, the gradient amplifier filter 300 includes an input end 301 connected to the gradient amplifier 210 and an output end 303 connected to the gradient coil.

In some embodiments, the gradient amplifier filter 300 is provided in the scan room, and may be specifically provided at a position close to the main magnet 240, e.g., in the space 250. More specifically, the gradient amplifier filter 300 may be integrated with a corresponding gradient amplifier 210 (e.g., provided in an electronic device housing for accommodating the gradient amplifier 210).

A plurality of embodiments of the gradient amplifier filter 300 described above will be described in detail below with reference to FIG. 3 to FIG. 9.

Figure 3:
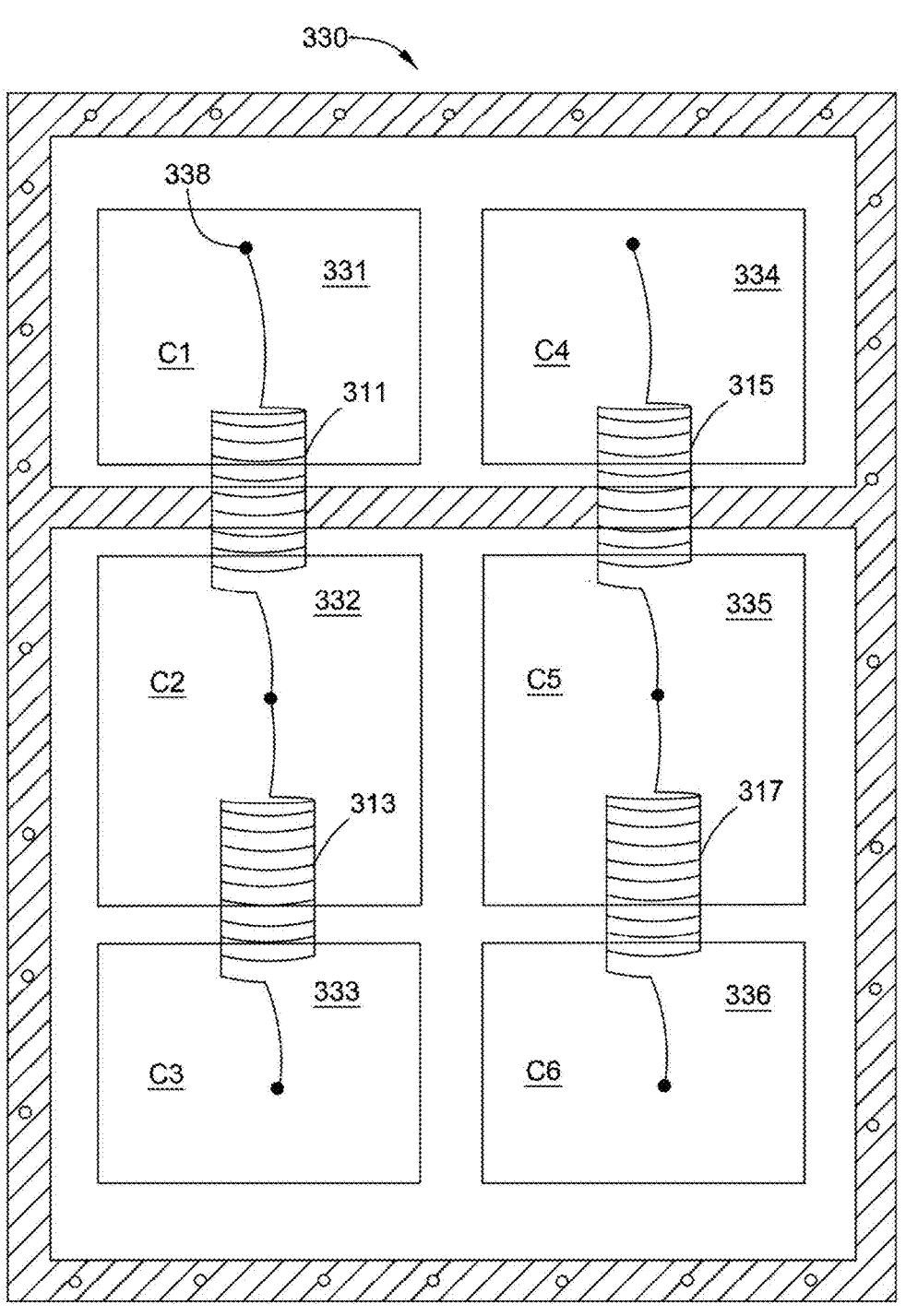
FIG. 3 shows a schematic structural diagram of a gradient amplifier filter according to some embodiments of the present invention.

As shown in FIG. 3, the gradient amplifier filter 300 according to an embodiment of the present invention includes a plurality of non-magnetic core inductors and a printed circuit board 330 having a multilayer structure. A plurality of filter capacitors are formed in a plurality of regions of the printed circuit board 330, respectively, each non-magnetic core inductor being provided on the printed circuit board 330 and spanning two of the plurality of filter capacitors.

FIG. 3 shows filter capacitors C1 to C6 formed in six regions 331 to 336 of the printed circuit board 330. Although FIG. 3 shows only the surface design of the printed circuit board 330, it can be understood that the printed circuit board 330 has a certain thickness. As shown in FIG. 3, a non-magnetic core inductor 311 spans the filter capacitors C1 and C2, a non-magnetic core inductor 313 spans the filter capacitors C2 and C3, a filter inductor 315 spans the filter capacitors C4 and C5, and a filter inductor 317 spans the filter capacitors C5 and C6. It has been experimentally proven that such a design makes it possible to satisfy dimensional requirements of spatial arrangement and to achieve a good filtering effect. However, it is possible to, as desired, change the overall size of the printed circuit board 330, provide a different number of filter capacitors and an arrangement thereof, or adjust the area of the region in which each filter capacitor is located.

By means of the combined design of the non-magnetic core inductors and the printed circuit board, the phenomenon of magnetic saturation caused when conventional magnetic core inductors are close to the main magnetic field is avoided, and as the frequency of the electric field increases, the filter capacitors can maintain the capacitances thereof well. Therefore, the gradient amplifier filter has a good frequency response, can be used under high frequency conditions, and can satisfy high frequency filtering in magnetic resonance applications, so that when the gradient amplifier and the filter connected to the gradient amplifier are both provided in positions close to the main magnet, a low-noise drive signal can still be provided to the gradient coil, thereby ensuring the effect and quality of magnetic resonance imaging.

In an embodiment of the present invention, the printed circuit board 330 includes stacked conductive layers. A dielectric layer is provided between adjacent conductive layers. The plurality of conductive layers include a plurality of signal layers and a plurality of ground layers arranged at intervals. The plurality of signal layers are connected together. Each of the plurality of signal layers includes a plurality of signal regions. The plurality of signal regions and adjacent ground layers form the plurality of filter capacitors.

Figure 4:
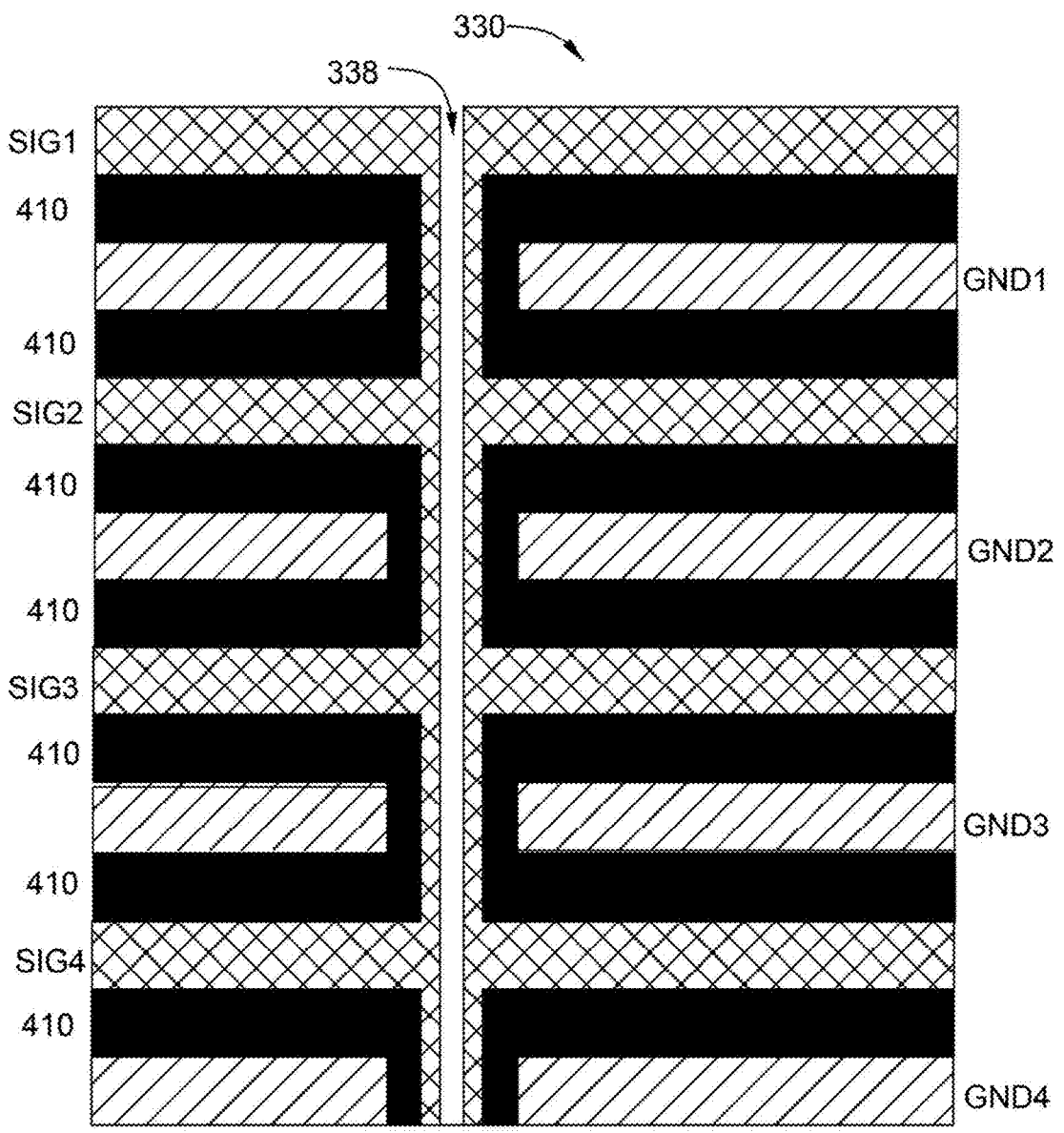
FIG. 4 shows a sectional view of a printed circuit board in FIG. 3.
Figure 5:
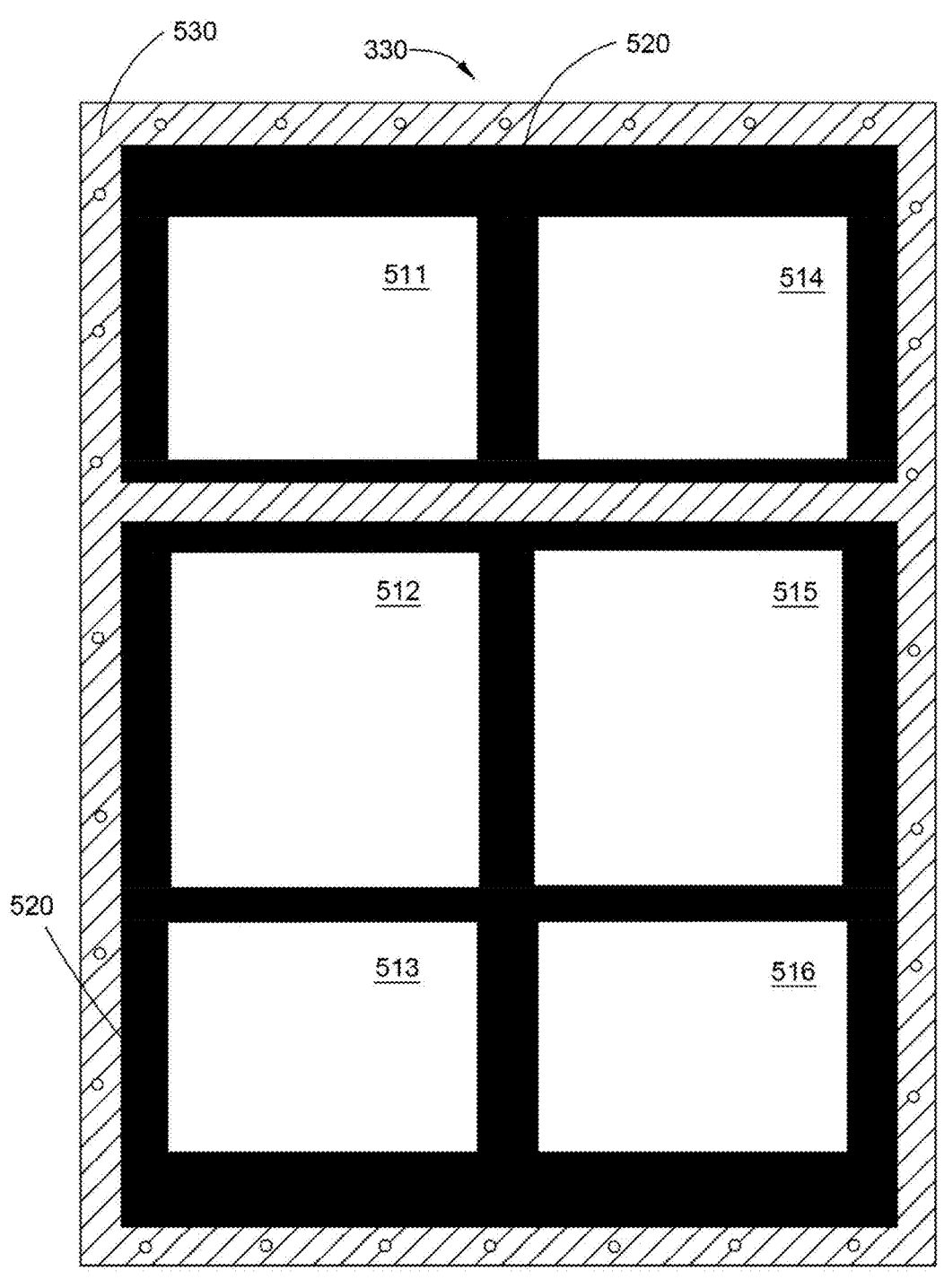
FIG. 5 shows a schematic structural diagram of a signal layer of the printed circuit board in FIG. 4.

FIG. 4 shows a sectional view of an example of the printed circuit board 330. FIG. 5 shows a schematic structural diagram of a signal layer of the printed circuit board 330. The printed circuit board includes four ground layers GND1 to GND4, and four signal layers SIG1 to SIG4. The four ground layers and the four signal layers are sequentially stacked at intervals, and a dielectric layer 410 is provided between each adjacent signal layer and ground layer. The means of design of each signal layer is consistent with the surface design shown in FIG. 3. That is, the signal regions (for example, the signal regions 511 to 516) on each signal layer are the same in number, size, and position as the six regions 331 to 336 shown in FIG. 3. That is, the signal regions on all the signal layers coincide with each other in a direction perpendicular to the printed circuit board 330, and the respective signal regions of all the signal layers are connected by means of through holes. The through holes may include, for example, through holes 338 in the six regions in FIG. 3. One end of each filter inductor may be connected to the filter capacitor by means of a pad connected to a through hole 338. For example, an example of a through hole 338 is also shown in the sectional view shown in FIG. 4.

In this way, when all the signal layers are stacked, the plurality of corresponding signal regions collectively form a separate capacitor structure. For example, all the signal regions 511 on the signal layers SIG1 to SIG4 (and the adjacent ground layers and the dielectric layers therebetween) form the vertically-extending region 331 to form the capacitor C1, and correspondingly all the signal regions 512 on the signal layers SIG1 to SIG4 (and the adjacent ground layers and the dielectric layers therebetween) form the vertically-extending region 332 to form the capacitor C2, and so on.

More specifically, each signal region on the stacked signal layers and the adjacent ground layers form the plurality of stacked capacitors, and the plurality of stacked capacitors are connected in parallel to form a filter capacitor. For example, in the region 331 of the printed circuit board 330, the signal layer SIG1 and the ground layer GND1 form a first parallel capacitor, the signal layer SIG2 and the ground layer GND1 form a second parallel capacitor, the signal layer SIG2 and the ground layer GND2 form a third parallel capacitor, the signal layer SIG3 and the ground layer GND2 form a fourth parallel capacitor, the signal layer SIG3 and the ground layer GND3 form a fifth parallel capacitor, the signal layer SIG4 and the ground layer GND3 form a sixth parallel capacitor, the signal layer SIG4 and the ground layer GND4 form a seventh parallel capacitor, and the first to seventh parallel capacitors collectively form the capacitor C1. Similarly, the other capacitors C2 to C6 are formed on the printed circuit board in a similar manner.

The plurality of signal regions of each signal layer are insulated from each other. For example, in FIG. 3, in each signal layer, among the regions 511 to 516, an insulating material is provided between adjacent signal regions to form an insulating gap 520. In one embodiment, the insulating material may be the same as the material of the dielectric layers 410. The material may include, for example, RF-4, having a dielectric constant typically between 4.2 and 4.7. The material may also be other insulating materials that can be used for printed circuit boards.

As shown in FIG. 3, a ground region 530 is further formed on each signal layer, the ground region 530 of each signal layer being formed around the signal regions on the signal layer and insulated from each signal region. Specifically, the ground region 530 of each signal layer is electrically connected to the adjacent ground layers, thereby achieving an equivalent design of a capacitive ground. Such an electrical connection may also be achieved by means of, for example, a through hole passing through the ground region 530 and each ground layer.

Figure 6:
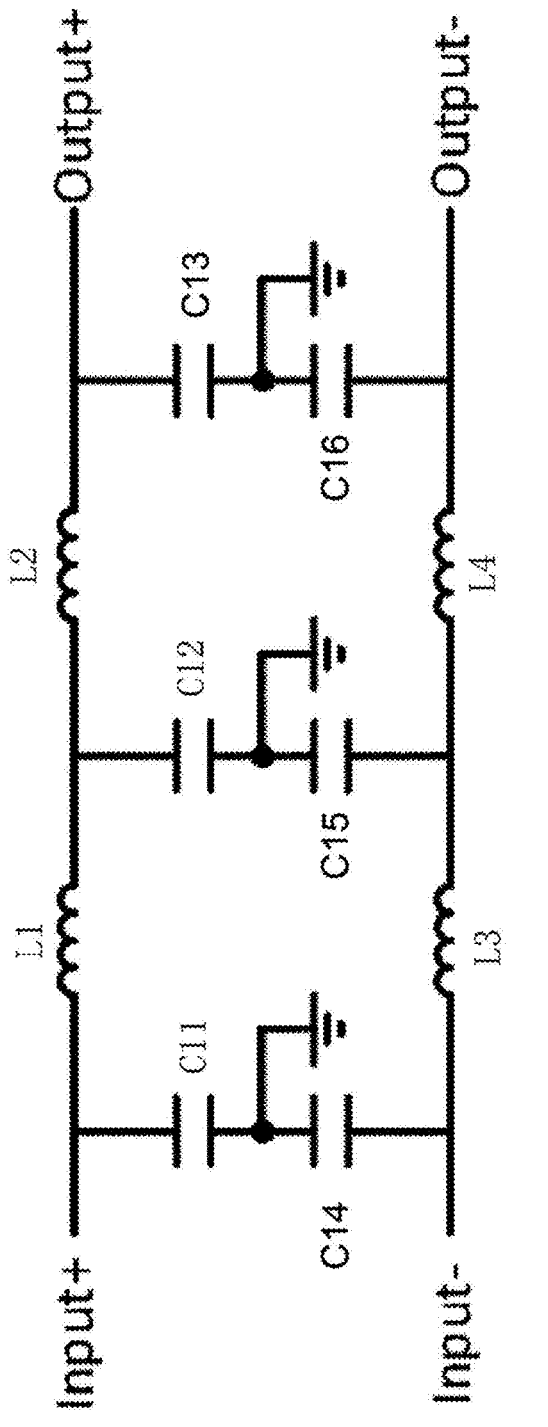
FIG. 6 shows an equivalent circuit diagram of the gradient amplifier filter in FIG. 3.

As shown in FIG. 3, in an embodiment of the present invention, the plurality of filter capacitors include a plurality of first capacitors (e.g., C1 to C3 in FIG. 3) formed side by side and a plurality of second capacitors (e.g., C4 to C6 in FIG. 3) formed side by side. The printed circuit board has symmetric first and second portions, the first portion including the plurality of first capacitors, and the second portion including the plurality of second capacitors. The plurality of first capacitors and the plurality of second capacitors are opposite to each other one to one. One of the plurality of non-magnetic core inductors spans two adjacent first capacitors, and one of the plurality of non-magnetic core inductors spans two adjacent second capacitors. In this way, an equivalent circuit 600 as shown in FIG. 6 is achieved. The circuit 600 includes capacitors C11 to C16 and inductors L1 to L4. The capacitors C11 to C16 are equivalent to the described capacitors C1 to C6, respectively, and the inductors L1 to L4 are equivalent to the non-magnetic core inductors 311, 313, 315 and 317, respectively. When the amplifier filter is connected to the gradient amplifier of the magnetic resonance system, an output end of the gradient amplifier is connected to an ungrounded end (i.e., the corresponding signal regions of the signal layers, equivalent to positive input Input+ and negative input Input−) of the capacitor C1, C4 or an end of the non-magnetic core inductor 311, 315 coupled thereto, and an ungrounded end (i.e., the corresponding signal regions of the signal layers, equivalently positive output Output+ and negative output Output−) of the capacitor C3, C6 or an end of the non-magnetic core inductor 313, 317 coupled thereto is connected to the corresponding gradient coil.

In an embodiment of the present invention, areas of the plurality of first capacitors are different from each other, and areas of the plurality of second capacitors are different from each other. In this way, if the layer thickness, the material, and the like of the printed circuit board are fixed, a required capacitance parameter is achieved by designing the areas of the signal regions, thereby meeting parameter requirements of the amplifier filter. The parameter requirements include, for example, the range of the operating frequencies of the filter.

In an embodiment of the present invention, the distances between adjacent capacitors may be different, so that if the layer thickness, the material, the signal region area, and the like of the printed circuit board are fixed, the parameter requirements of the amplifier filter are met by designing the distances between adjacent signal regions. For example, the distances between two adjacent first capacitors may be different, and the distances between two adjacent second capacitors may also be different.

Figure 7:
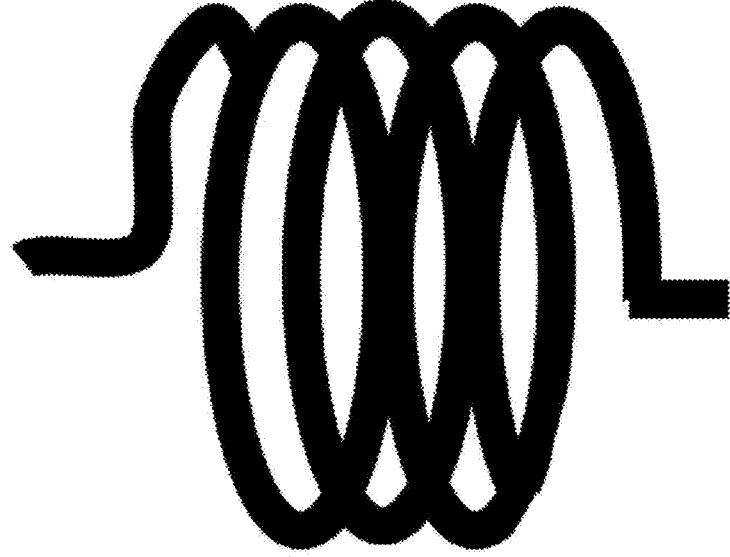
FIG. 7 and FIG. 8 respectively show different winding methods of a coil of a non-magnetic core inductor in FIG. 3.
Figure 8:
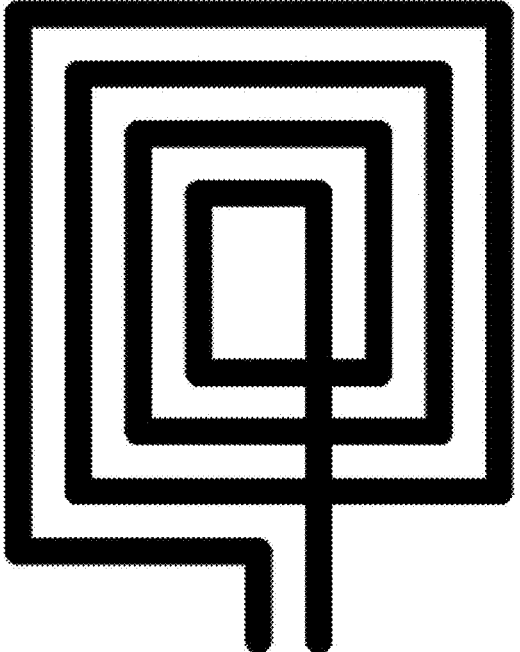
Figure 9:
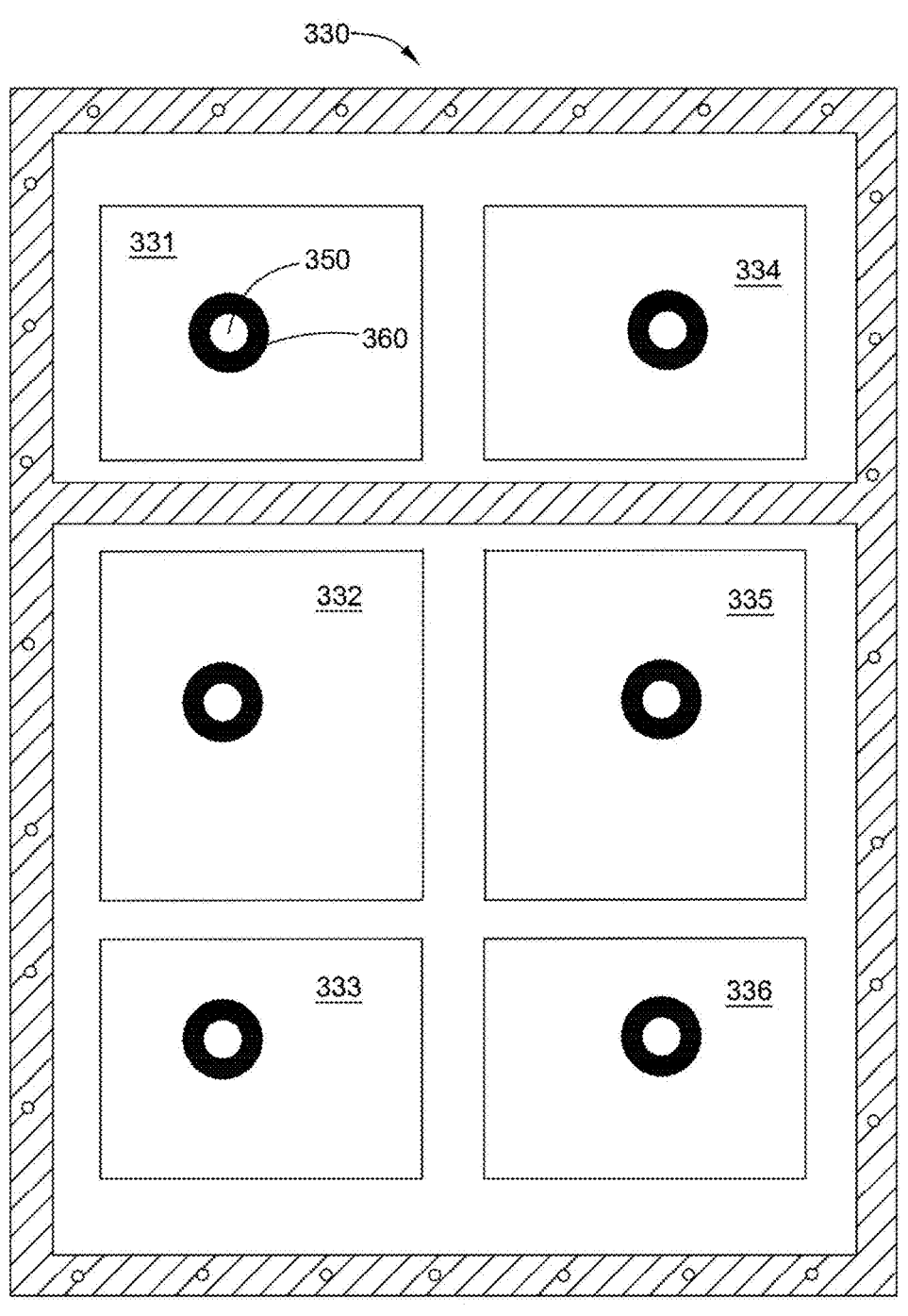
FIG. 9 shows a plurality of through holes provided on the printed circuit board in FIG. 3.

In an embodiment of the present invention, each non-magnetic core inductor may be an air core inductor. The air core inductor is, for example, a solenoid air core inductor without a ferromagnetic core, including a solenoid conductive coil that may be helically wound to have a cylindrical inner surface as shown in FIG. 7. The air core inductor may also include a flat conductive coil that may be wound into, for example, a mosquito-coil structure as shown in FIG. 8. Said two types of inductors may facilitate reduction of the size of the amplifier filter and reduction of the footprint of the filter, so that the mounting position is more flexible.

In an embodiment of the present invention, two ends of each non-magnetic core inductor are each fixed by means of screws in regions in which two of the plurality of filter capacitors are located. Using the non-magnetic core inductor 311 as an example, one end thereof is fixed in the region 331 (the filter capacitor C1) of the printed circuit board by means of a first screw, and the other end is fixed in the region 332 (the filter capacitor C2) of the printed circuit board by means of a second screw.

Specifically, a through hole 338 for engaging with the screw is provided in a region of the printed circuit board in which each filter capacitor is located. The through hole passes through the plurality of conductive layers and the plurality of dielectric layers. An insulating region surrounding the through hole is provided on each ground layer. The insulating region extends outwards from a hole wall of the through hole. For example, in FIG. 9, a hole 350 is provided in each of the six regions on the printed circuit board 330, and in each ground layer, and an insulating region 360 formed by a ring of insulating material is provided around each hole 350 to isolate the hole 350 from a conductive region to avoid signal crosstalk. The hole 350 may be the through hole 338 in FIG. 3 and FIG. 4.

In other embodiments, each non-magnetic core inductor may form an electrically coupled structure by being soldered to a pad on the printed circuit board.

In embodiments of the present invention, regions are separately provided on a printed circuit board to form a plurality of filter capacitors, and each non-magnetic core inductor spans two capacitors to form a filter, so that magnetic saturation is avoided when the filter is arranged close to a main magnet, and the filter can be used under high frequency conditions, and has greatly reduced volume, weight and costs compared with existing gradient amplifier filters.

Figure 10:
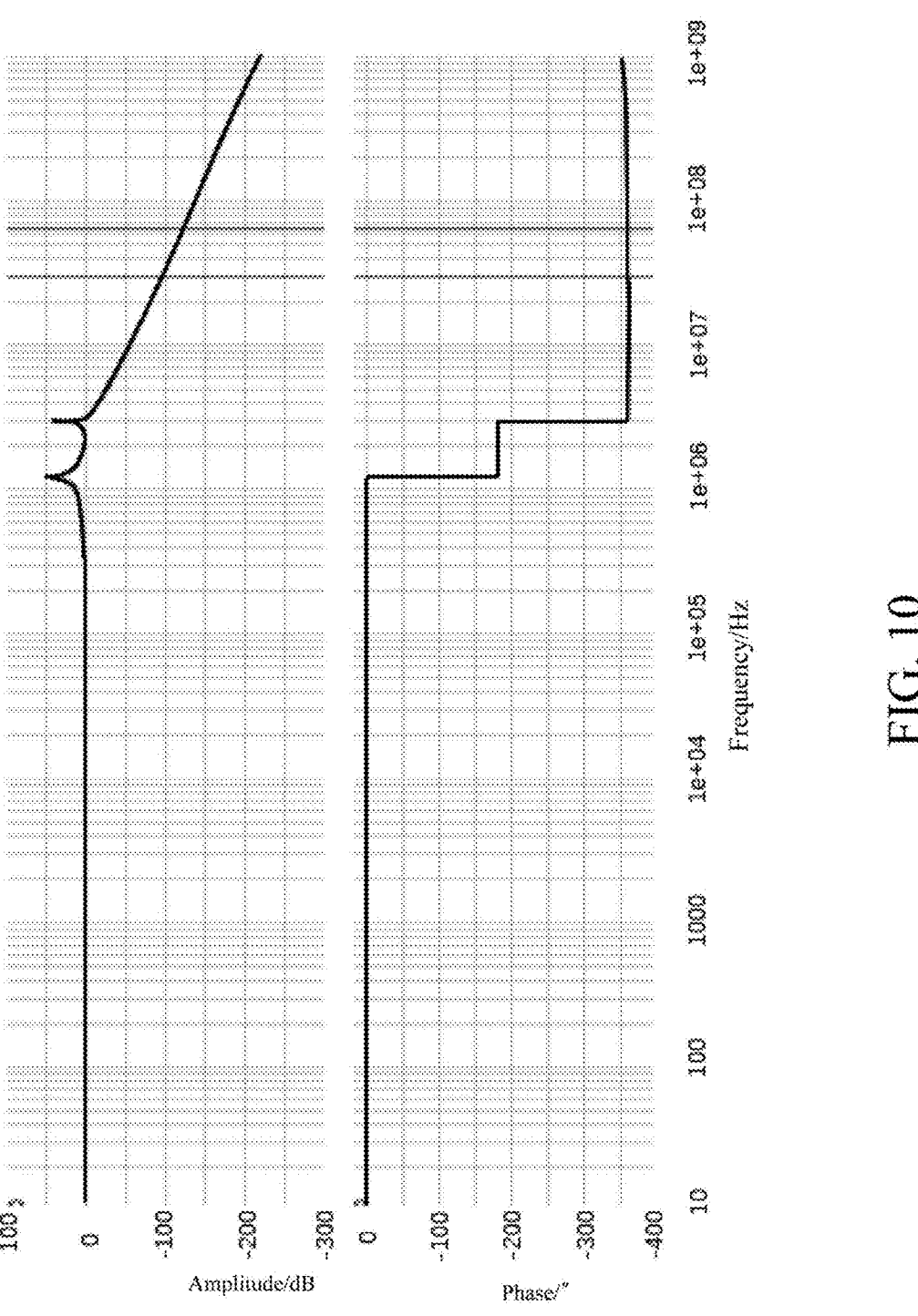
Figure 11:
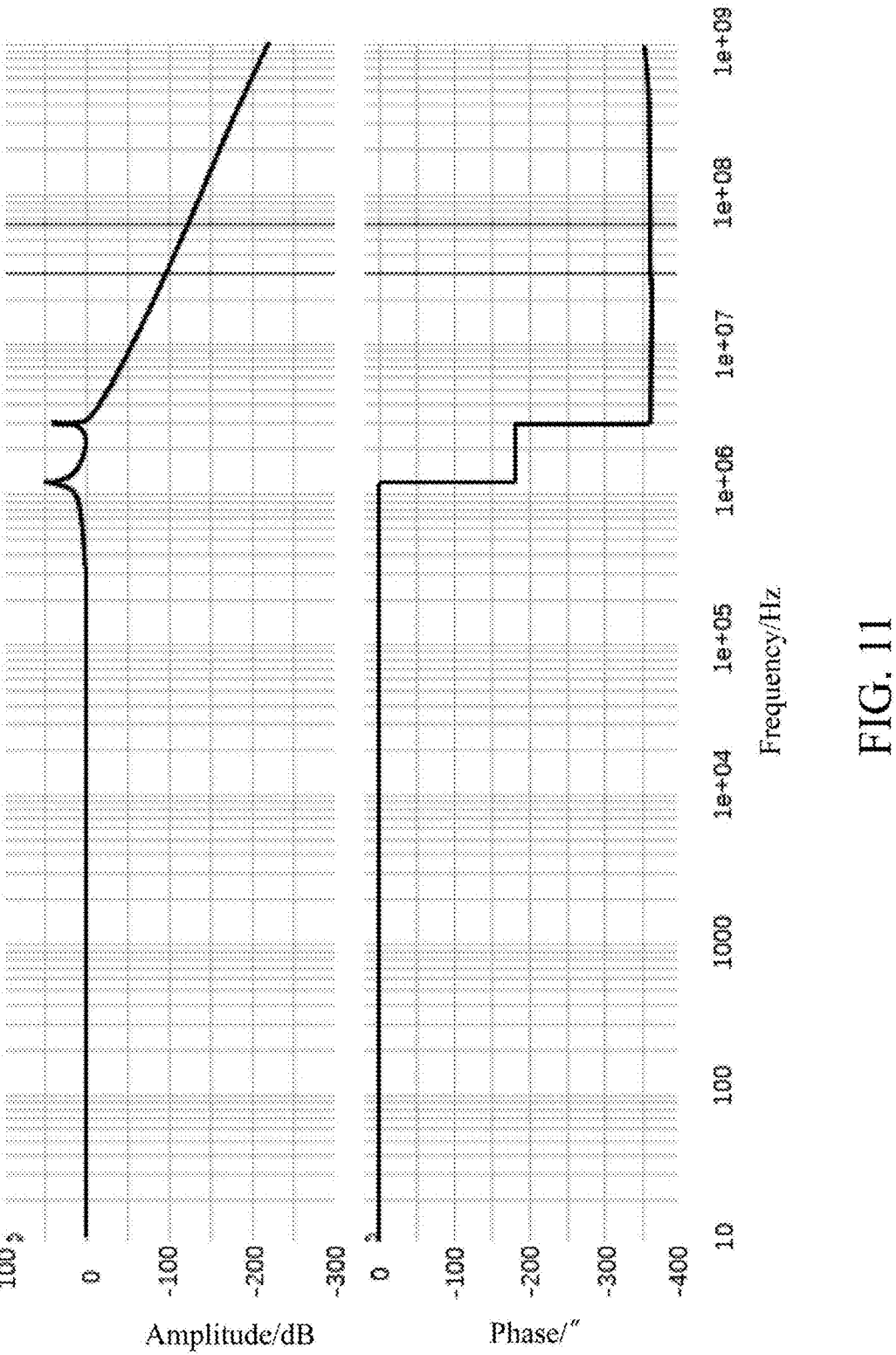

FIG. 10 and FIG. 11 each show a schematic diagram of an attenuation test performed on a gradient amplifier filter according to an embodiment of the present invention, wherein FIG. 10 shows the results of a common mode attenuation test, and FIG. 11 shows the results of a differential mode attenuation test. In FIG. 10 and FIG. 11, the abscissa axis represents the frequency, and the ordinate axis separately represents the amplitude and the phase. As can be seen from the test results, the gradient amplifier filter of the present invention has a good frequency response, and has low signal attenuation at main magnetic field frequencies for magnetic resonance applications (e.g., around 63.8 MHz and around 128 MHz).

In addition to any previously indicated modifications, many other variations and replacement arrangements may be devised by those skilled in the art without departing from the substance and scope of the present description, and the appended claims are intended to encompass such modifications and arrangements. Therefore, although the information has been described above in specifics and details in connection with what is currently considered to be the most practical and preferred aspects, it will be apparent to those of ordinary skill in the art that many modifications can be made, including, but not limited to, modifications to the form, function, mode of operation, and use, without departing from the principles and concepts set forth herein. Likewise, as used herein, in all respects, the examples and embodiments are intended to be illustrative only and should not be construed as limiting in any way.

The purpose of providing the above specific embodiments is to facilitate understanding of the content disclosed in the present invention more thoroughly and comprehensively, but the present invention is not limited to these specific embodiments. Those skilled in the art should understand that various modifications, equivalent replacements, and changes can also be made to the present invention and should be included in the scope of protection of the present invention as long as these changes do not depart from the spirit of the present invention.

The invention claimed is:

1. A gradient amplifier filter for a magnetic resonance system, comprising:
    a plurality of non-magnetic core inductors; and
    a printed circuit board having a multilayer structure, a plurality of filter capacitors being formed in a plurality of regions of the printed circuit board, respectively, wherein each non-magnetic core inductor is provided on the printed circuit board and spanning two of the plurality of filter capacitors.

2. The gradient amplifier filter according to claim 1, characterized in that the printed circuit board comprises a plurality of stacked conductive layers, and a dielectric layer is provided between adjacent conductive layers, wherein the plurality of conductive layers comprise a plurality of signal layers and a plurality of ground layers arranged at intervals, the plurality of signal layers being connected together, each of the plurality of signal layers comprising a plurality of signal regions to form the plurality of filter capacitors with adjacent ground layers, and the plurality of signal regions of each signal layer being insulated from each other.

3. The gradient amplifier filter according to claim 2, characterized in that a ground region is further formed on each signal layer, and the ground region of each signal layer is formed around the signal regions on the signal layer and is insulated from the signal regions.

4. The gradient amplifier filter according to claim 3, characterized in that the ground region of each signal layer is electrically connected to the adjacent ground layers.

5. The gradient amplifier filter according to claim 1, characterized in that the plurality of filter capacitors comprise a plurality of first capacitors formed side by side and a plurality of second capacitors formed side by side, the printed circuit board having symmetric first and second portions, the first portion comprising the plurality of first capacitors, the second portion comprising the plurality of second capacitors, the plurality of first capacitors and the plurality of second capacitors being opposite each other one to one, one of the plurality of non-magnetic core inductors spanning two adjacent first capacitors, and one of the plurality of non-magnetic core inductors spanning two adjacent second capacitors.

6. The gradient amplifier filter according to claim 5, characterized in that areas of the plurality of first capacitors are different from each other, and areas of the plurality of second capacitors are different from each other.

7. The gradient amplifier filter according to claim 5, characterized in that the distances between each two adjacent first capacitors are different, and the distances between each two adjacent second capacitors are different.

8. The gradient amplifier filter according to claim 2, characterized in that two ends of each non-magnetic core inductor are each fixed by means of screws in regions in which two of the plurality of filter capacitors are located.

9. The gradient amplifier filter according to claim 8, characterized in that a through hole for engaging with the screw is provided in a region of the printed circuit board in which each filter capacitor is located, the through hole passing through the plurality of conductive layers and the plurality of dielectric layers, an insulating region surrounding the through hole being provided on each ground layer, and the insulating region extending outwards from a hole wall of the through hole.

10. The gradient amplifier filter according to claim 1, characterized in that each non-magnetic core inductor is an air core inductor.

11. The gradient amplifier filter according to claim 1, characterized in that each non-magnetic core inductor comprises a flat conductive coil or a solenoid conductive coil.

12. The gradient amplifier filter according to claim 1, characterized in that the filter is electrically connected to a gradient amplifier of the magnetic resonance system, and is arranged together with the gradient amplifier in a magnet housing of the magnetic resonance system.

13. A magnetic resonance system, comprising:

a magnet housing in which a main magnet, a gradient coil, and a gradient amplifier are provided; and the gradient amplifier filter according to claim 1, the filter comprising an input end connected to the gradient amplifier and an output end connected to the gradient coil.

\* \* \* \* \*